United States Patent
Okada et al.

(10) Patent No.: US 9,599,676 B2
(45) Date of Patent: Mar. 21, 2017

(54) APPARATUS AND METHOD FOR ESTIMATING POWER STORAGE DEVICE DEGRADATION

(71) Applicants: Yuruki Okada, Tokyo (JP); Sho Shiraga, Tokyo (JP); Toshihiro Wada, Tokyo (JP); Shoji Yoshioka, Tokyo (JP)

(72) Inventors: Yuruki Okada, Tokyo (JP); Sho Shiraga, Tokyo (JP); Toshihiro Wada, Tokyo (JP); Shoji Yoshioka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 81 days.

(21) Appl. No.: 14/762,635

(22) PCT Filed: Mar. 18, 2013

(86) PCT No.: PCT/JP2013/057717
§ 371 (c)(1),
(2) Date: Jul. 22, 2015

(87) PCT Pub. No.: WO2014/147725
PCT Pub. Date: Sep. 25, 2014

(65) Prior Publication Data
US 2015/0369870 A1 Dec. 24, 2015
US 2016/0245870 A2 Aug. 25, 2016

(51) Int. Cl.
*H02J 7/00* (2006.01)
*G01R 31/36* (2006.01)
(Continued)

(52) U.S. Cl.
CPC ..... *G01R 31/3624* (2013.01); *G01R 31/3648* (2013.01); *G01R 31/3662* (2013.01);
(Continued)

(58) Field of Classification Search
CPC ............ G01R 31/3624; G01R 31/3648; G01R 31/3662; G01R 31/3679; H01M 10/44; H01M 10/48
(Continued)

(56) References Cited

U.S. PATENT DOCUMENTS

2005/0029990 A1 2/2005 Tsukamoto et al.
2006/0087291 A1 4/2006 Yamauchi
(Continued)

FOREIGN PATENT DOCUMENTS

EP 2 838 152 A1 2/2015
JP 2000-258513 A 9/2000
(Continued)

OTHER PUBLICATIONS

The extended European Search Report issued on Oct. 20, 2016, by the European Patent Office in corresponding European Patent Application No. 13879041.5-1568. (7 pages).
(Continued)

*Primary Examiner* — Edward Tso
*Assistant Examiner* — Aaron Piggush
(74) *Attorney, Agent, or Firm* — Buchanan Ingersoll & Rooney PC

(57) ABSTRACT

Switches change the resistance value of a charge/discharge circuit in a period from starting a discharging at an upper limit voltage until the voltage reaches a lower limit voltage. An electric charge estimator computes electric charge by time-integrating current from a start of the discharging to an arbitrarily determined time, and computes a relationship between electric charge and voltage of a power storage device. An internal resistance estimator computes internal resistance based on voltages and currents of the storage device at times when resistance values are different. An electric energy estimator computes a relationship between (Continued)

electric charge and open voltage based on electric charge, voltage, current and internal resistance of the storage device. During charging or discharging of the storage device, the electric energy estimator estimates the electric energy of the power storage device based on the electric charge, the open voltage, the internal resistance, and the charge/discharge current.

3 Claims, 13 Drawing Sheets

(51) Int. Cl.
*H01M 10/44* (2006.01)
*H01M 10/48* (2006.01)

(52) U.S. Cl.
CPC ........... *H01M 10/44* (2013.01); *H01M 10/48* (2013.01); *G01R 31/3679* (2013.01)

(58) Field of Classification Search
USPC ........ 320/132, 134, 136, 159, 164; 324/427, 324/428, 430; 702/63
See application file for complete search history.

(56) References Cited

U.S. PATENT DOCUMENTS

| | | | |
|---|---|---|---|
| 2011/0109273 A1 | 5/2011 | Tamezane | |
| 2013/0027047 A1 | 1/2013 | Yoshioka et al. | |
| 2013/0080096 A1* | 3/2013 | Toki | G01R 31/3624 702/63 |
| 2013/0166235 A1* | 6/2013 | Oh | G01R 31/3624 702/63 |
| 2015/0061601 A1 | 3/2015 | Hatanaka et al. | |

FOREIGN PATENT DOCUMENTS

| | | |
|---|---|---|
| JP | 2003-157912 A | 5/2003 |
| JP | 2007-17357 A | 1/2007 |
| JP | 2008-123961 A | 5/2008 |
| JP | 2012-57956 A | 3/2012 |
| KR | 10-2006-0052273 A | 5/2006 |
| KR | 10-2008-0073382 A | 8/2008 |
| KR | 10-2012-0139818 A | 12/2012 |
| KR | 10-2013-0018310 A | 2/2013 |

OTHER PUBLICATIONS

Office Action (Preliminary Rejection) issued on Apr. 7, 2016, by the Korean Patent Office in corresponding Korean Patent Application No. 10-2015-7024432, and an English Translation of the Office Action. (10 pages).
International Search Report (PCT/ISA/210) mailed on May 28, 2013, by the Japanese Patent Office as the International Searching Authority for International Application No. PCT/JP2013/057717.
Written Opinion (PCT/ISA/237) mailed on May 28, 2013, by the Japanese Patent Office as the International Searching Authority for International Application No. PCT/JP2013/057717.

\* cited by examiner

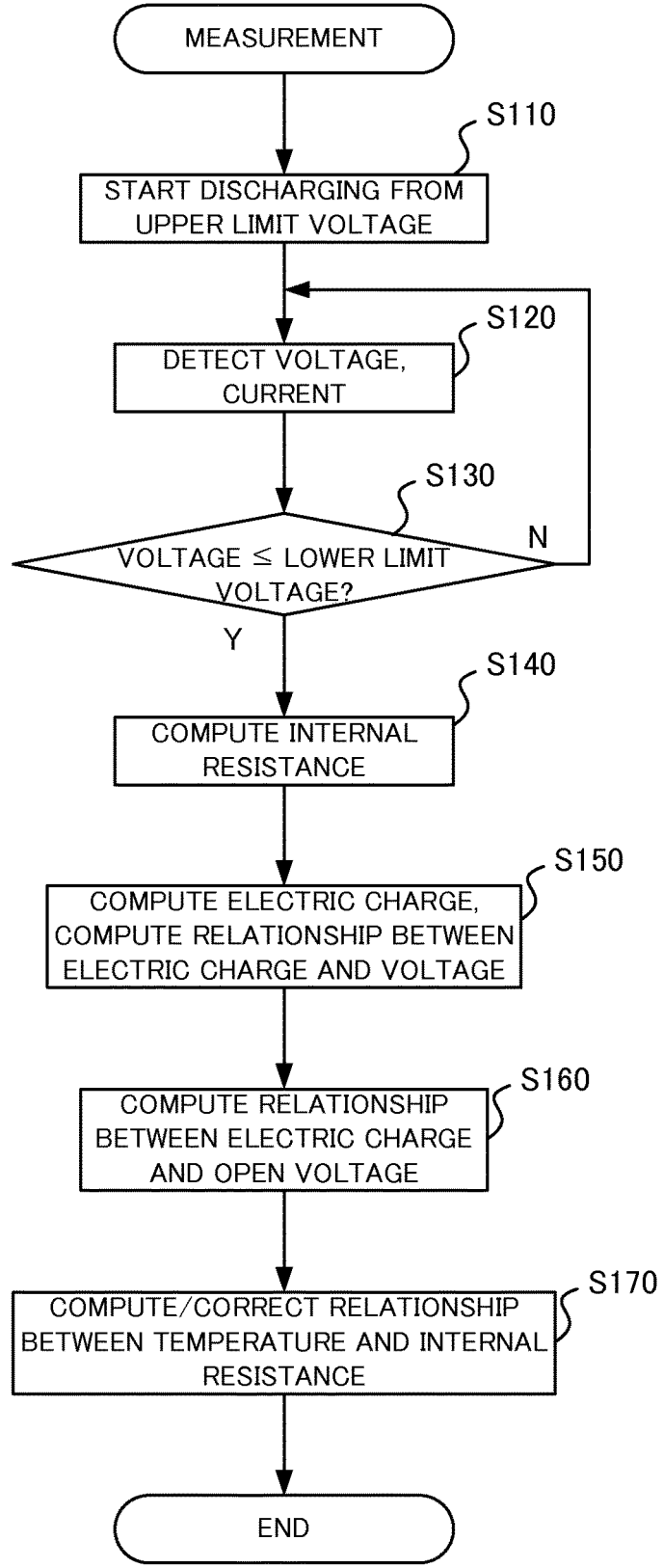

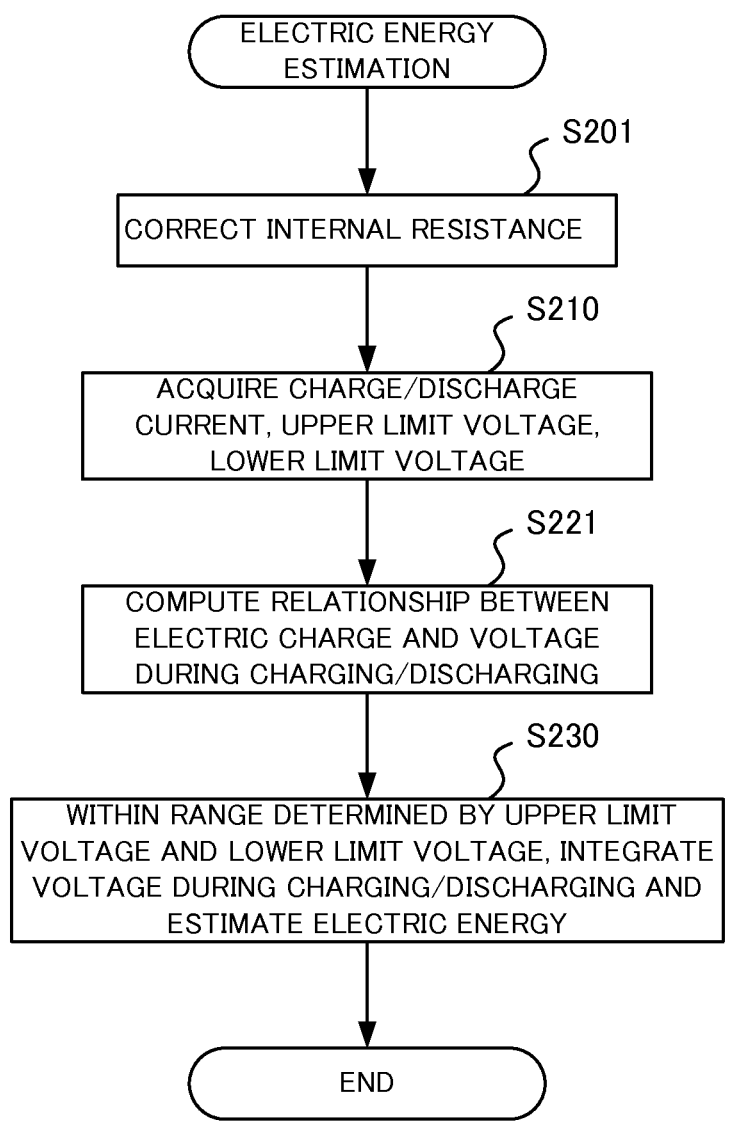

APPARATUS AND METHOD FOR ESTIMATING POWER STORAGE DEVICE DEGRADATION

TECHNICAL FIELD

The present disclosure relates to an apparatus and a method for estimating power storage device degradation, which estimates the electric energy of a power storage device.

BACKGROUND ART

To control the charging and discharging of a power storage device, it is necessary to accurately assess the dischargeable power and the chargeable power. In other words, it is necessary to accurately assess the open voltage (open-circuit voltage), the internal resistance, and the state of charge (SOC).

Directly measuring the state of charge of a power storage device is difficult. However, a degree of correlation between the SOC and the open voltage of a power storage device has been recognized. Accordingly, with the method of computing the SOC of a secondary battery for an electric vehicle disclosed in Patent Literature 1, the battery internal resistance of a secondary battery is computed by multiplying a predetermined resistance value, a first resistance ratio based on battery temperature, and a second resistance ratio based on a given reference state of charge. Subsequently, the open voltage is computed from the computed battery internal resistance as well as the current and voltage of a battery during charging or discharging, and the SOC of the battery is computed based on the correlation of the SOC with the open voltage.

The remaining battery capacity detection apparatus disclosed in Patent Literature 2 connects a load resistor to a secondary battery to cause a constant current discharge, and based on the voltage between the terminals immediately after starting the constant current discharge and after a certain time elapses, detects a polarization value dominated by internal mass movement or a resistance value dominated by internal mass movement based on how easily reactive matter inside the electrodes moves to a reaction site in the secondary battery. Subsequently, the SOC of the secondary battery is detected based on the polarization value dominated by internal mass movement or the resistance value dominated by internal mass movement.

The battery degradation measurement apparatus disclosed in Patent Literature 3 computes the internal resistance of a battery based on the battery voltages when different charging current values are supplied, and computes a battery cell degradation ratio based on the ratio against the internal resistance in an initial state.

The battery degradation level estimation apparatus disclosed in Patent Literature 4 uses relationship data obtained by pre-measuring the relationship between the charge amount and the open voltage value for each of different degradation levels, and computes a degradation level of a battery based on an electric charge of the battery computed by time-integrating a charge/discharge current value detected with a current sensor.

CITATION LIST

Patent Literature

Patent Literature 1: Unexamined Japanese Patent Application Kokai Publication No. 2000-258513

Patent Literature 2: Unexamined Japanese Patent Application Kokai Publication No. 2007-017357

Patent Literature 3: Unexamined Japanese Patent Application Kokai Publication No. 2008-123961

Patent Literature 4: Unexamined Japanese Patent Application Kokai Publication No. 2012-057956

SUMMARY OF INVENTION

Technical Problem

Degradation, in which the capacity of a power storage device decreases, may occur because mechanical damage or detachment has occurred in some of the chargeable or dischargeable reaction sites inside a battery, for example. In this case, it is difficult to estimate the degradation of a power storage device with a method that estimates the degradation of a power storage device based on internal resistance, as with the technology disclosed in Patent Literature 1 and 2.

With the battery degradation measuring apparatus disclosed in Patent Literature 3, estimating the degradation of a power storage device becomes difficult when the degradation of the capacity of the power storage device and the increase in the internal resistance do not advance at the same time.

With the battery degradation level estimating apparatus disclosed in Patent Literature 4, since a relationship between the charge amount and the open voltage is acquired for each degradation level in advance, it is necessary to acquire data by predicting various mechanisms of degradation under actual usage conditions in advance. However, sufficiently predicting the mechanisms of degradation under actual usage conditions is difficult.

The present disclosure was devised in light of the above circumstances, and an objective thereof is to improve the accuracy of estimating the electric energy of a power storage device.

Solution to Problem

To achieve the above objective, an apparatus for estimating power storage device degradation according to the present disclosure is provided with a charge/discharge circuit, a switch, a voltage detector, a current detector, a circuit selector, an electric charge estimator, an internal resistance estimator, and an electric energy estimator. The charge/discharge circuit includes a resistor, and is connected to a power storage device. The switch switches an electrical pathway of the charge/discharge circuit to change a resistance value of the charge/discharge circuit. The voltage detector detects a voltage of the power storage device. The current detector detects a current flowing through the power storage device. The circuit selector switches the switch so that a resistance value of the charge/discharge circuit changes at least once from starting a discharging of the power storage device in a state in which the voltage is equal to or greater than a first threshold value until the voltage becomes less than or equal to a second threshold value, or from starting a charging of the power storage device in a state in which the voltage is less than or equal to a third threshold value until the voltage becomes equal to or greater than a fourth threshold value. The electric charge estimator computes an electric charge by time-integrating the current from a start time of the discharging or the charging to an arbitrarily determined time, and computes a relationship between the electric charge and the voltage. The internal resistance estimator computes an internal resistance of the power storage device, based on the voltages and currents at times when resistance values of the charge/discharge circuit are different since starting the discharging or the charging. The electric energy estimator computes a relationship between the electric charge and an open voltage of the power storage device based on a relationship between the electric charge and the voltage, the current, and the internal resistance, and estimates an electric energy of the power storage device based on a relationship between the electric charge and the open voltage, the internal resistance, and a current flowing through the power storage device during discharging or charging.

Advantageous Effects of Invention

According to the present disclosure, it becomes possible to improve the accuracy of estimating the electric energy of a power storage device.

BRIEF DESCRIPTION OF DRAWINGS

FIG. 14 is a flowchart illustrating an example of measurement operations conducted by the apparatus for estimating power storage device degradation according to Embodiment 2; and FIG. 15 is a flowchart illustrating an example of electric energy estimation operations conducted by the apparatus for estimating power storage device degradation according to Embodiment 2.

DESCRIPTION OF EMBODIMENTS

Figure 1:
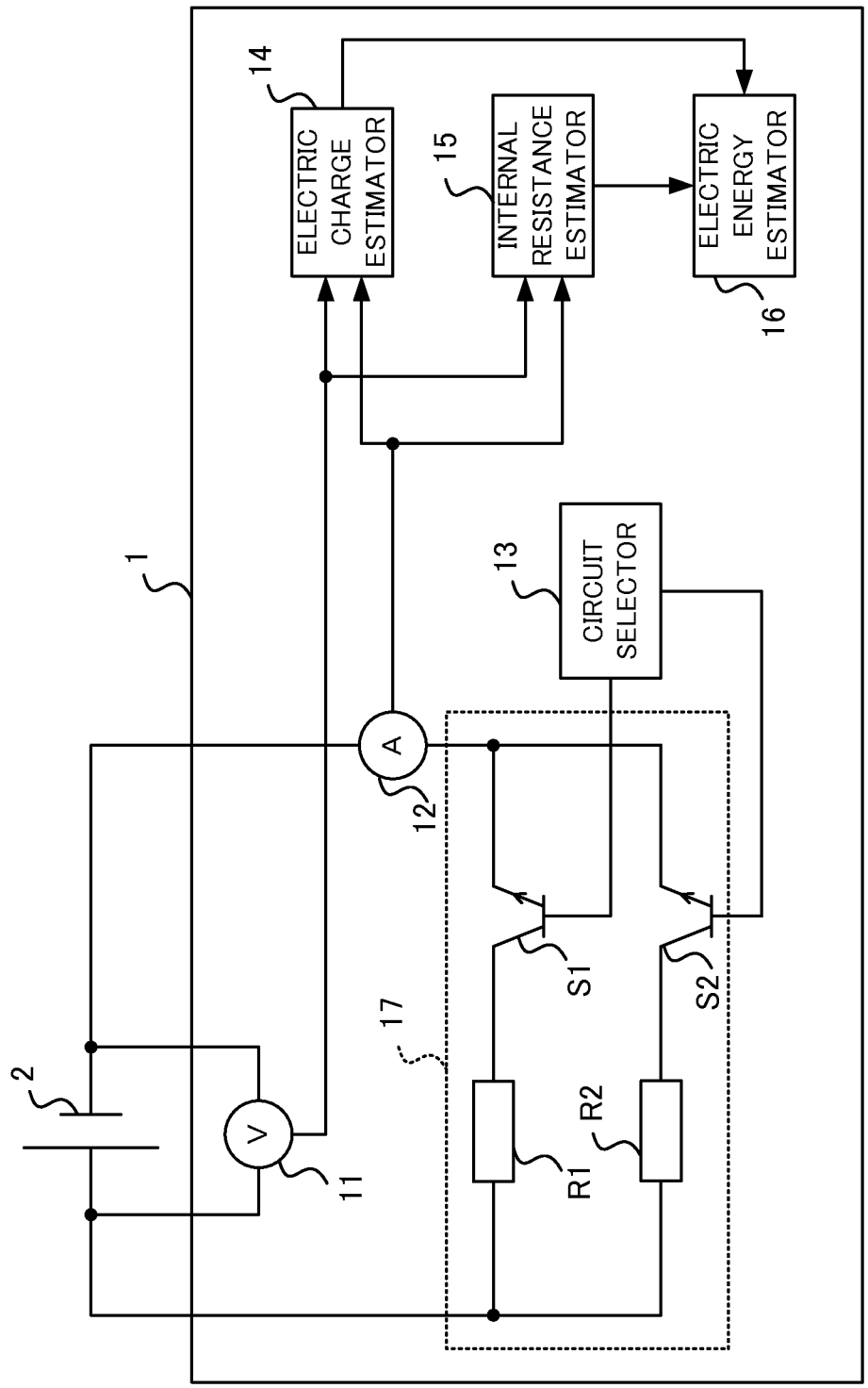
FIG. 1 is a block diagram illustrating an example configuration of an apparatus for estimating power storage device degradation according to Embodiment 1 of the present disclosure.

Hereinafter, embodiments of the present disclosure are described in detail and with reference to the drawings. Note that in the drawings, the same signs are given to the same or similar parts.

Embodiment 1

FIG. 1 is a block diagram illustrating an example configuration of an apparatus for estimating power storage device degradation according to Embodiment 1 of the present disclosure. The apparatus for estimating power storage device degradation 1 is provided with a voltage detector 11, a current detector 12, a circuit selector 13, an electric charge estimator 14, an internal resistance estimator 15, an electric energy estimator 16, resistors R1 and R2, and switches S1 and S2. The power storage device 2 is a secondary battery, for example, a nickel-metal hydride battery or a lithium-ion battery. As the power storage device 2 is repeatedly charged and discharged, the capacity of the power storage device 2 decreases due to degradation caused by the repeated charging and discharging, and the amount of storable electric energy decreases. The apparatus for estimating power storage device degradation 1 estimates degradation in the power storage device 2, or in other words, estimates the electric energy of the power storage device 2.

A circuit composed of the resistor R1 and the switch S1, and a circuit composed of the resistor R2 and the switch S2 constitute a charge/discharge circuit 17. One end of the charge/discharge circuit 17 is connected to a positive electrode of the power storage device 2, while the other end is connected to a negative electrode of the power storage device 2. One end of each of the resistors R1 and R2 is connected to the positive electrode of the power storage device 2, while each of the other ends thereof is respectively connected to the switch S1 and the switch S2. Transistors may be used for the switching elements S1 and S2. In the example of FIG. 1, the collector terminal of the switches S1 and S2 is respectively connected to the resistor R1 and the resistor R2, while the emitter terminal of the switches S1 and S2 is connected to the negative electrode of the power storage device 2 via the current detector 12. The base terminal of the switches S1 and S2 is connected to the circuit selector 13. Switching on and off the switches S1 and S2 switches the electrical pathway and changes the resistance value of the charge/discharge circuit 17.

The voltage detector 11 detects the voltage between the positive electrode and the negative electrode of the power storage device 2 (hereinafter simply called the voltage). The current detector 12 detects the current flowing through the power storage device 2 (hereinafter simply called the current). The circuit selector 13 outputs a gate signal to the switches S1 and S2 according to an arbitrarily determined control pattern, thereby switching the switches S1 and S2 on and off. The control pattern of the switches S1 and S2 is arbitrarily determined so that the resistance value of the charge/discharge circuit 17 changes at least once during charging or discharging. The electric charge estimator 14 time-integrates the current from the start time of discharging or charging of the power storage device 2 to an arbitrarily determined time, computes the amount of electric charge (units: Ah) discharged or charged, and computes a relationship between the electric charge and the voltage.

The internal resistance estimator 15 computes the internal resistance of the power storage device 2 based on the voltages and currents at times when the resistance values of the charge/discharge circuit 17 are different. The electric energy estimator 16 computes the relationship between the electric charge and the open voltage of the power storage device 2 based on the relationship between the electric charge and the voltage computed by the electric charge estimator 14, the current, and the internal resistance.

Based on the values computed as discussed above, when discharging or charging the power storage device 2, the electric energy estimator 16 estimates the electric energy of the power storage device 2 based on the relationship between the electric charge and the open voltage of the power storage device 2, the internal resistance, and the current when discharging or charging the power storage device 2.

Figure 2:
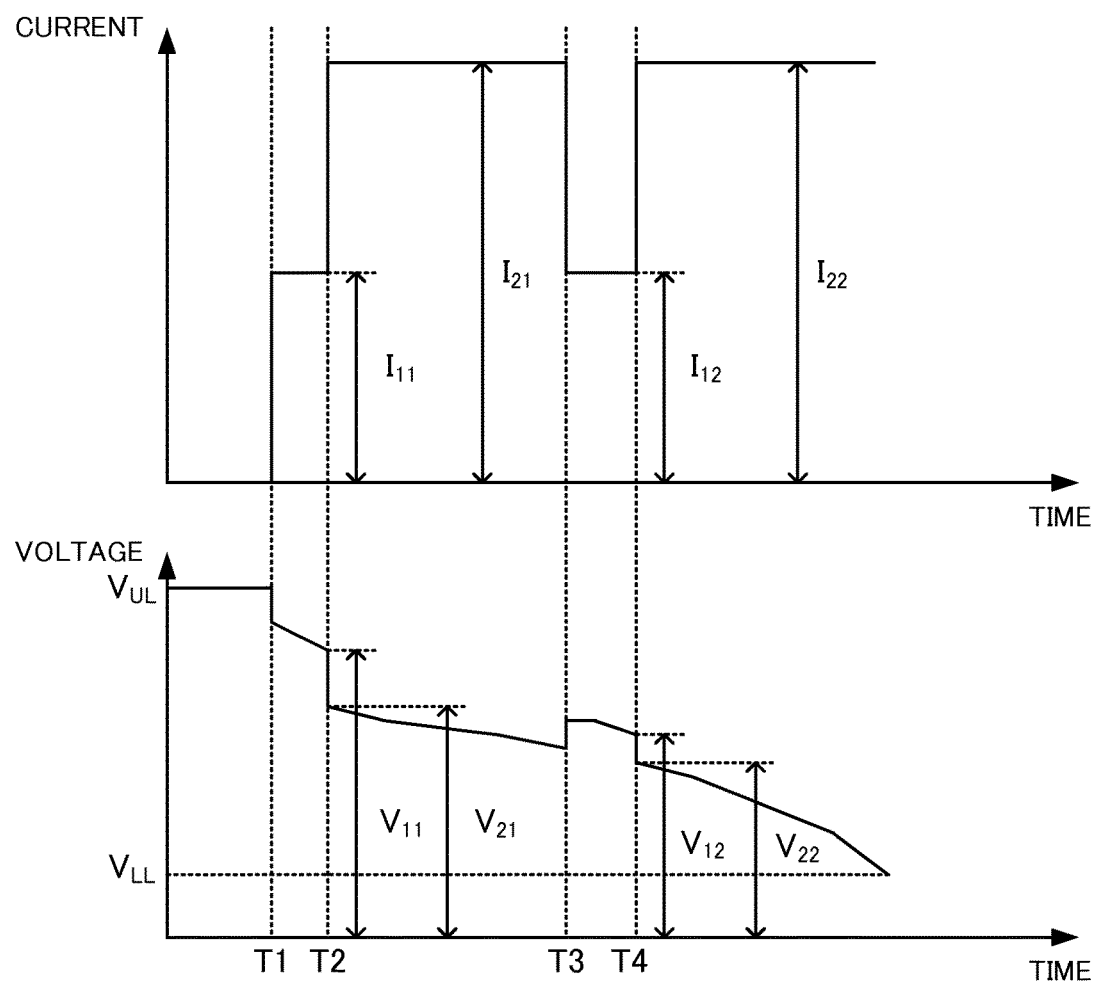
FIG. 2 is a diagram illustrating an example of changes in a current flowing through a power storage device and in a voltage of the power storage device according to Embodiment 1.

FIG. 2 is a diagram illustrating an example of changes in a current flowing through the power storage device and in the voltage of the power storage device according to Embodiment 1. The top part illustrates the current, while the bottom part illustrates the voltage. The horizontal axis is time, while the vertical axis of the top part is current, and the vertical axis of the bottom part is voltage. An example will be described for a case in which discharging starts in a state in which the voltage is equal to or greater than a first threshold value, and discharging continues until the voltage becomes less than or equal to a second threshold value. Note that the first threshold value and the second threshold value may be arbitrarily determined. For example, an upper limit voltage of the power storage device 2 is set to the first threshold value, and a lower limit voltage of the power storage device 2 is set to the second threshold value. Note that a discharge current is expressed as positive. As illustrated in FIG. 2, the voltage changes from an upper limit voltage $V_{UL}$ to a lower limit voltage $V_{LL}$.

Starting from a state in which the voltage is the upper limit voltage $V_{UL}$ and the switches S1 and S2 are off, at time T1, the switch S1 is switched on, and discharging of the power storage device 2 starts. During the period from time T1 to time T2, the current is $I_{11}$, and the voltage decreases to $V_{11}$ over the period from time T1 to time T2. At time T2, the switch S2 is additionally switched on, the current becomes $I_{21}$, and the voltage becomes $V_{21}$. During the period from time T2 to time T3, the current is $I_{21}$, and the voltage decreases over the period from time T2 to time T3. At time T3, the switch S2 is switched off, the current becomes $I_{12}$, and the voltage increases to approximately $V_{21}$. During the period from time T3 to time T4, the current is $I_{12}$, and the voltage decreases to $V_{12}$ over the period from time T3 to time T4. At time T4, the switch S2 is switched on, the current becomes $I_{22}$, and the voltage becomes $V_{22}$. Starting from time T4, the voltage detector 11 and the current detector 12 detect the voltage and the current at arbitrarily determined intervals until the voltage reaches the lower limit voltage.

The internal resistance estimator 15 computes the internal resistance of the power storage device 2 based on the voltages and currents at times when the resistance values of the charge/discharge circuit 17 are mutually different, such as immediately before and immediately after time T2, for example. The internal resistance $R_{B1}$ based on the voltage and the current immediately before and immediately after time T2 is expressed as $R_{B1}=|V_{11}-V_{21}|/|I_{11}-I_{21}|$. Also, the internal resistance $R_{B2}$ based on the voltage and the current immediately before and immediately after time T4 is expressed as $R_{B2}=|V_{12}-V_{22}|/|I_{12}-I_{22}|$. Provided that $V_{1n}$ is the voltage and $I_{1n}$ is the current immediately before an arbitrary time at which the switches S1 and S2 are switched, and $V_{2n}$ is the voltage and $I_{2n}$ is current immediately after the arbitrary time, the internal resistance $R_{Bn}$ based on the voltage and the current immediately before and immediately after the arbitrary time is expressed as $R_{Bn}=|V_{1n}-V_{2n}|/|I_{1n}-I_{2n}|$.

Figure 3:
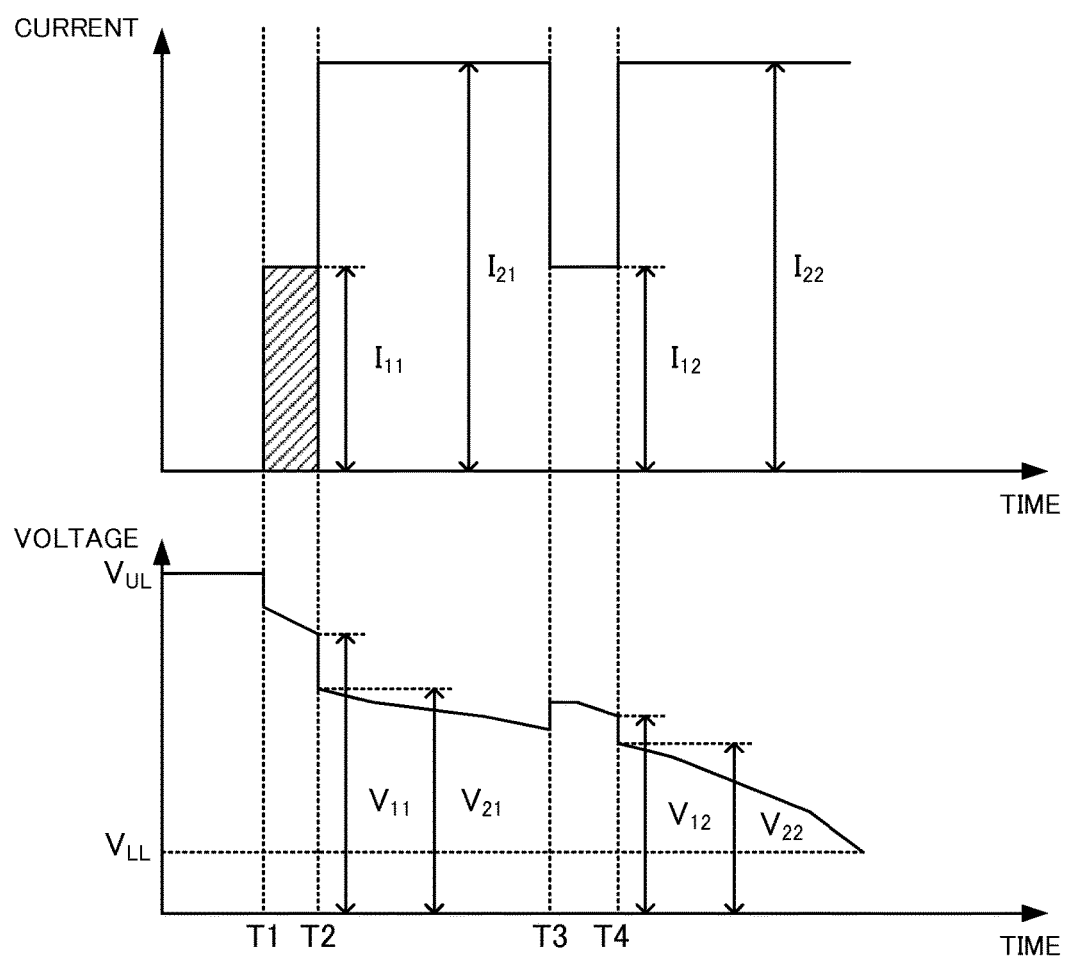
FIG. 3 is a diagram illustrating an example of computing electric charge according to Embodiment 1.
Figure 4:
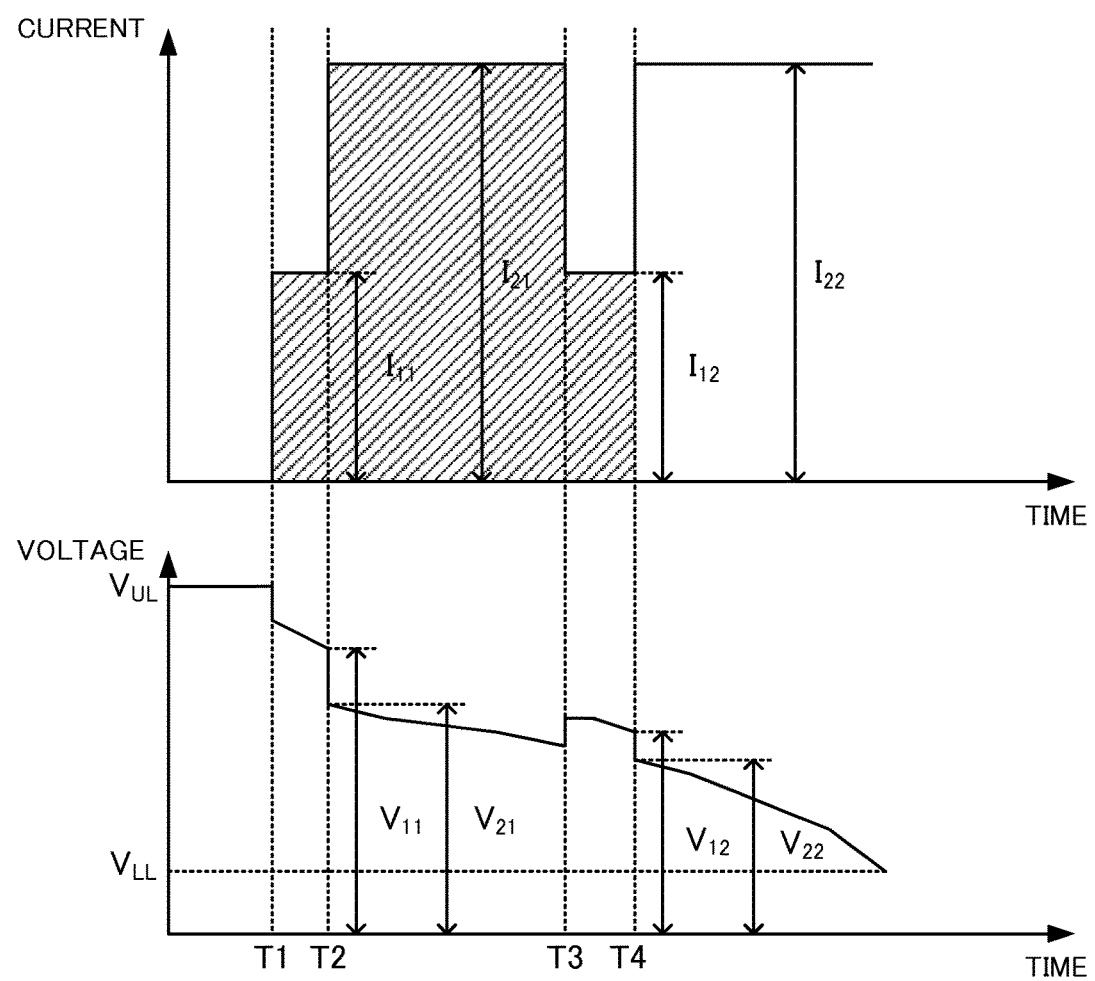
FIG. 4 is a diagram illustrating an example of computing electric charge according to Embodiment 1.

FIGS. 3 and 4 are diagrams illustrating an example of computing electric charge according to Embodiment 1. The electric charge estimator 14 computes the electric charge by time-integrating the current from time T1 when discharging started, until time T2, for example. The electric charge $Q_1$ computed based on the current from time T1 to time T2 corresponds to the area of the shaded part in FIG. 3. Also, the electric charge estimator 14 computes the electric charge by time-integrating the current from time T1 when discharging started, until time T4, for example. The electric charge $Q_2$ computed based on the current from time T1 to time T4 corresponds to the area of the shaded part in FIG. 4.

Figure 5:
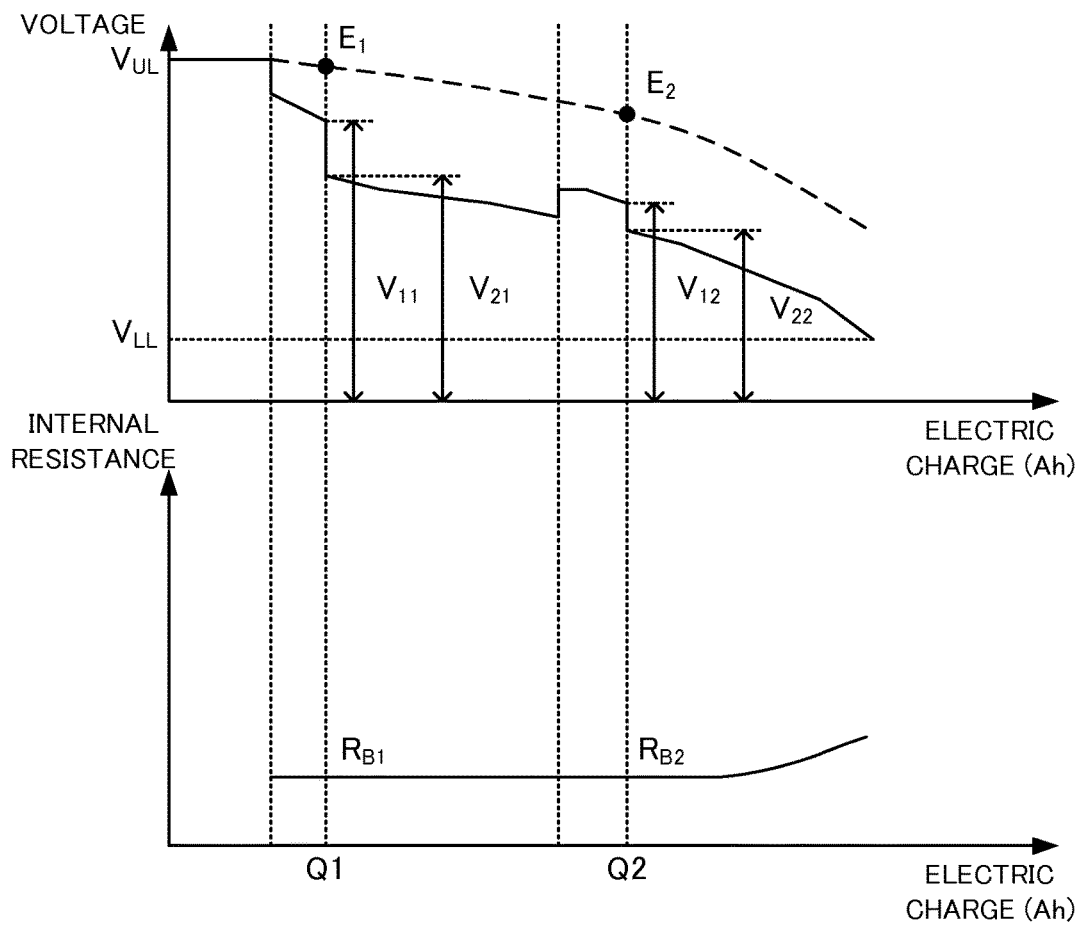
FIG. 5 is a diagram illustrating an example of a relationship between electric charge and the voltage of the power storage device, and a relationship between electric charge and an internal resistance, according to Embodiment 1.

The electric charge estimator 14 associates the voltage $V_{11}$ immediately before time T2 with the electric charge $Q_1$ based on the current from time T1 to time T2, and associates the voltage $V_{12}$ immediately before time T4 with the electric charge $Q_2$ based on the current from time T1 to time T4. The electric charge estimator 14 computes the electric charge based on the current from the start time of discharging to an arbitrarily determined time as discussed above, and computes the relationship between the electric charge and the voltage. FIG. 5 is a diagram illustrating an example of a relationship between electric charge and the voltage of the power storage device, and the relationship between electric charge and the internal resistance, according to Embodiment 1. The solid-line graph in the top part of FIG. 5 indicates the relationship between the electric charge and the voltage. The electric charge estimator 14 computes a relationship between electric charge and voltage like the solid-line graph in the top part of FIG. 5, for example.

The electric charge based on the current from time T1 to time T2 is $Q_1$, and the electric charge based on the current from time T1 to time T4 is $Q_2$. Also, the internal resistance based on the voltage and the current immediately before and immediately after time T2 is $R_{B1}$, and the internal resistance based on the voltage and the current immediately before and immediately after time T4 is $R_{B2}$. Consequently, the relationship between the internal resistance and the electric charge is expressed like the bottom part of FIG. 5. If the internal resistance estimator 15 conducts an interpolation process using as a reference the internal resistance computed based on the voltage and the current at predetermined timings, a relationship between the electric charge and the internal resistance like the graph in the bottom part of FIG. 5 is obtained, for example.

The electric energy estimator 16 computes the relationship between the electric charge and the open voltage of the power storage device 2 based on the relationship between the electric charge and the voltage indicated by the solid line in the top part of FIG. 5, the current, and the internal resistance. The open voltage $E_1$ of the power storage device 2 corresponding to the electric charge $Q_1$ is expressed as $E_1=V_{11}+I_{11}\cdot R_{B1}$. Also, the open voltage $E_2$ of the power storage device 2 corresponding to the electric charge $Q_2$ is expressed as $E_2=V_{12}+I_{12}\cdot R_{B2}$. Provided that $Q_n$ is the electric charge corresponding to the internal resistance $R_{Bn}$ based on the voltage and the current immediately before and immediately after an arbitrary time, the open voltage $E_n$ of the power storage device 2 corresponding to the electric charge $Q_n$ is expressed as $E_n=V_{1n}+I_{1n}\cdot R_{Bn}$. The electric energy estimator 16 computes the open voltage with respect to the electric charge as discussed above, and computes the relationship between the electric charge and the open voltage of the power storage device 2 as indicated by the dashed line in the top part of FIG. 5.

Figure 6:
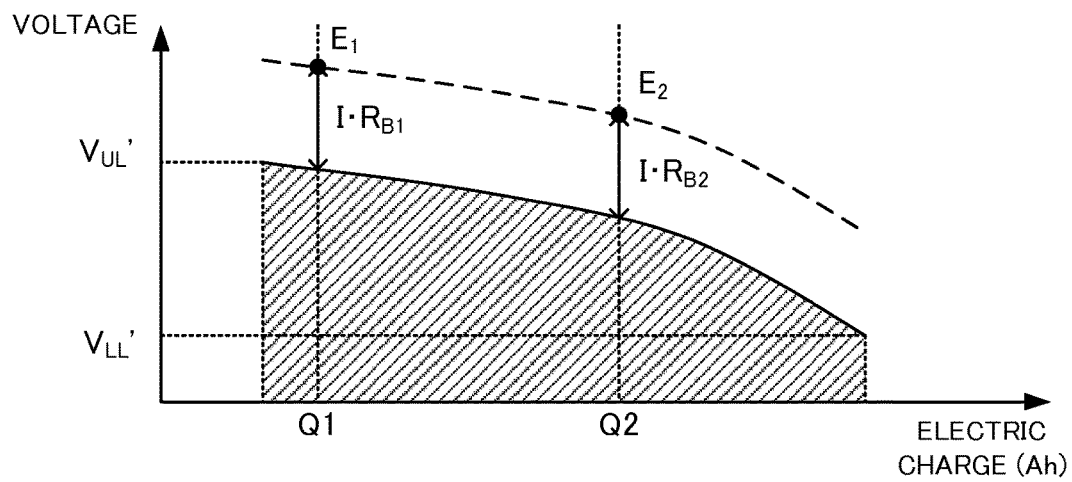
FIG. 6 is a diagram illustrating an example of estimating the electric energy of the power storage device according to Embodiment 1.

Based on the values computed as discussed above, the electric energy estimator 16 estimates the electric energy of the power storage device 2 based on usage conditions when the power storage device 2 is used. Electric energy estimation is described below. An example will be described for a case of discharging the power storage device 2 from a state in which the voltage of the power storage device 2 is the upper limit voltage until the voltage reaches the lower limit voltage, while keeping the discharge current at a constant value I. The electric energy estimator 16 acquires the discharge current value I, and acquires the upper limit voltage $V_{UL}'$ and the lower limit voltage $V_{LL}'$ of the power storage device 2 during discharging. FIG. 6 is a diagram illustrating an example of estimating the electric energy of the power storage device according to Embodiment 1. The dashed-line graph indicates the relationship between the electric charge and the open voltage of the power storage device 2. Provided that the discharge current is I, since a voltage drop occurs, the voltage $V_1$ of the power storage device 2 corresponding to the electric charge $Q_1$ is expressed as $V_1=E_1-I\cdot R_{B1}$. Also, the voltage $V_2$ of the power storage device 2 corresponding to the electric charge $Q_2$ is expressed as $V_2=E_2-I\cdot R_{B2}$.

The voltage of the power storage device 2 corresponding to the electric charge is computed similarly. For example, the voltage $V_n$ of the power storage device 2 corresponding to the electric charge $Q_n$ is expressed as $V_n=E_n-I\cdot R_{Bn}$. As discussed above, the electric energy estimator 16 computes the relationship between the electric charge and the voltage of the power storage device 2 during discharging when the discharge current is kept at a constant value I, based on the relationship between the electric charge and the open voltage of the power storage device 2, the internal resistance, and the discharge current I. The voltage of the power storage device 2 during discharging when the discharge current is kept at a constant value I changes like in the graph illustrated by the solid line in FIG. 6. Within the range determined by the upper limit voltage $V_{UL}'$ and the lower limit voltage $V_{LL}'$, the electric energy estimator 16 integrates the voltage of the power storage device 2 during discharging when the discharge current is kept at a fixed value I that corresponds to the electric charge, and estimates the electric energy (units: Wh) of the power storage device 2. The electric energy of the power storage device 2 corresponds to the area of the shaded part in FIG. 6.

Note that when charging the voltage of the power storage device 2, the electric energy estimator 16 may estimate the electric energy of the power storage device 2 according to the charging conditions, similarly to the example discussed above. Provided that the charge current is I, since I is negative value, the voltage $V_1$ of the power storage device 2 corresponding to the electric charge $Q_1$ is expressed as $V_1=E_1+I\cdot R_{B1}$. Also, the voltage $V_2$ of the power storage device 2 corresponding to the electric charge Q2 is expressed as $V_2=E_2+I\cdot R_{B2}$. Note that the range of the integral may also be determined based on the electric charge.

According to the apparatus for estimating power storage device degradation 1 according to Embodiment 1, the relationship between electric charge and the open voltage is computed based on the voltage and the current measured by the voltage detector 11 and the current detector 12, and the electric energy of the power storage device 2 may be estimated for individual discharging or charging conditions, excluding the effects of a voltage drop caused by internal resistance. Consequently, it becomes possible to improve the accuracy of estimating the electric energy of the power storage device 2.

Figure 7:
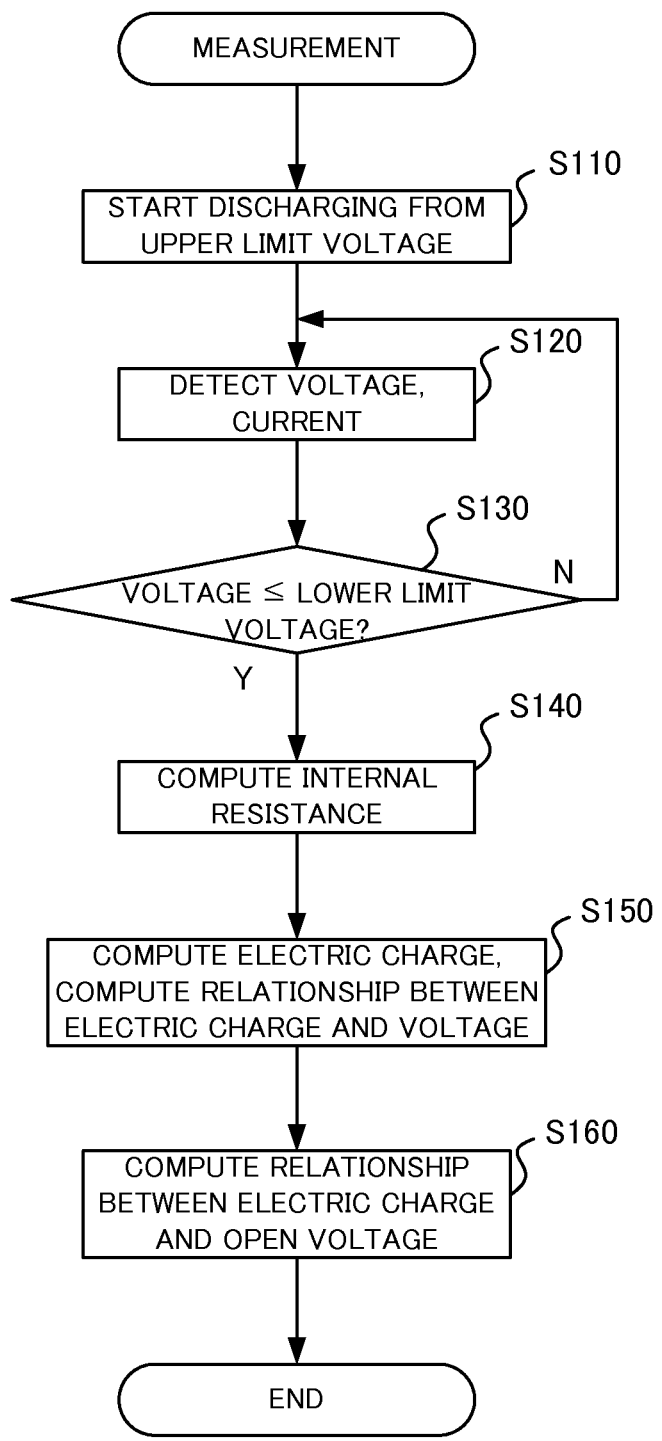
FIG. 7 is a flowchart illustrating an example of measurement operations conducted by the apparatus for estimating power storage device degradation according to Embodiment 1.

FIG. 7 is a flowchart illustrating an example of measurement operations conducted by the apparatus for estimating power storage device degradation according to Embodiment 1. An example will be described for a case in which discharging starts in a state in which the voltage of the power storage device 2 is equal to or greater than the first threshold value, and discharging is conducted until the voltage of the power storage device 2 becomes less than or equal to the second threshold value. Starting from a state in which the voltage of the power storage device 2 has reached the upper limit voltage and the switches S1 and S2 are off, the switch S1 is switched on, and discharging of the power storage device 2 starts (step S110). The voltage detector 11 detects the voltage of the power storage device 2, and the current detector 12 detects the current flowing through the power storage device 2 (step S120). While the voltage has not reached the lower limit voltage (step S130; N), the processing of step S120 is repeated.

When the voltage reaches the lower limit voltage (step S130; Y), the internal resistance estimator 15 computes the internal resistance of the power storage device 2 based on the voltages and currents at times when the resistance values of the charge/discharge circuit 17 are mutually different (step S140). The electric charge estimator 14 computes the electric charge by time-integrating the current from the start time of discharging to an arbitrarily determined time, and computes the relationship between the electric charge and the voltage (step S150). The electric energy estimator 16 computes the relationship between the electric charge and the open voltage of the power storage device 2 based on the relationship between the electric charge and the voltage, the current, and the internal resistance (step S160). After the processing of step S160 is completed, the apparatus for estimating power storage device degradation 1 ends the measurement process. The internal resistance computation processing of step S140 and the electric charge computation processing of step S150 are executed in an arbitrary order, and may also be processed in parallel.

Figure 8:
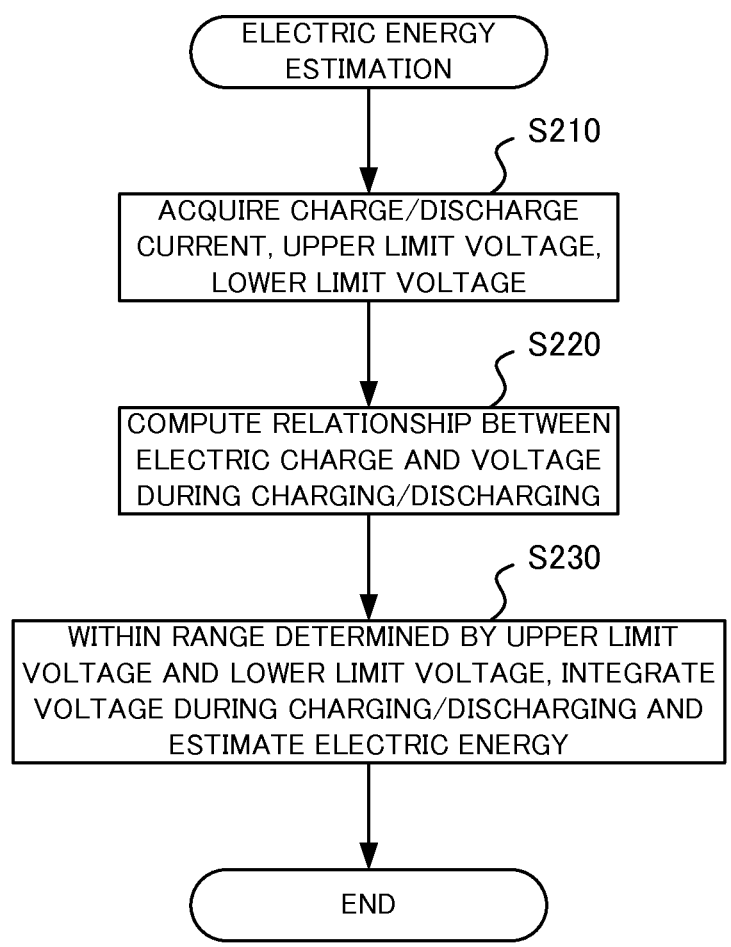
FIG. 8 is a flowchart illustrating an example of electric energy estimation operations conducted by the apparatus for estimating power storage device degradation according to Embodiment 1.

FIG. 8 is a flowchart illustrating an example of electric energy estimation operations conducted by the apparatus for estimating power storage device degradation according to Embodiment 1. The electric energy estimator 16 acquires a charge/discharge current, and acquires the upper limit voltage and the lower limit voltage of the power storage device 2 during charging or discharging (step S210). The electric energy estimator 16 computes the relationship between the electric charge and the voltage of the power storage device 2 during charging or discharging, based on the relationship between the electric charge and the open voltage of the power storage device 2, the internal resistance, and the charge/discharge current (step S220). Within the range determined by the upper limit voltage and the lower limit voltage, the electric energy estimator 16 integrates the voltage of the power storage device 2 during charging or discharging with respect to the electric charge, and estimates the electric energy of the power storage device 2 (step S230).

Figure 9:
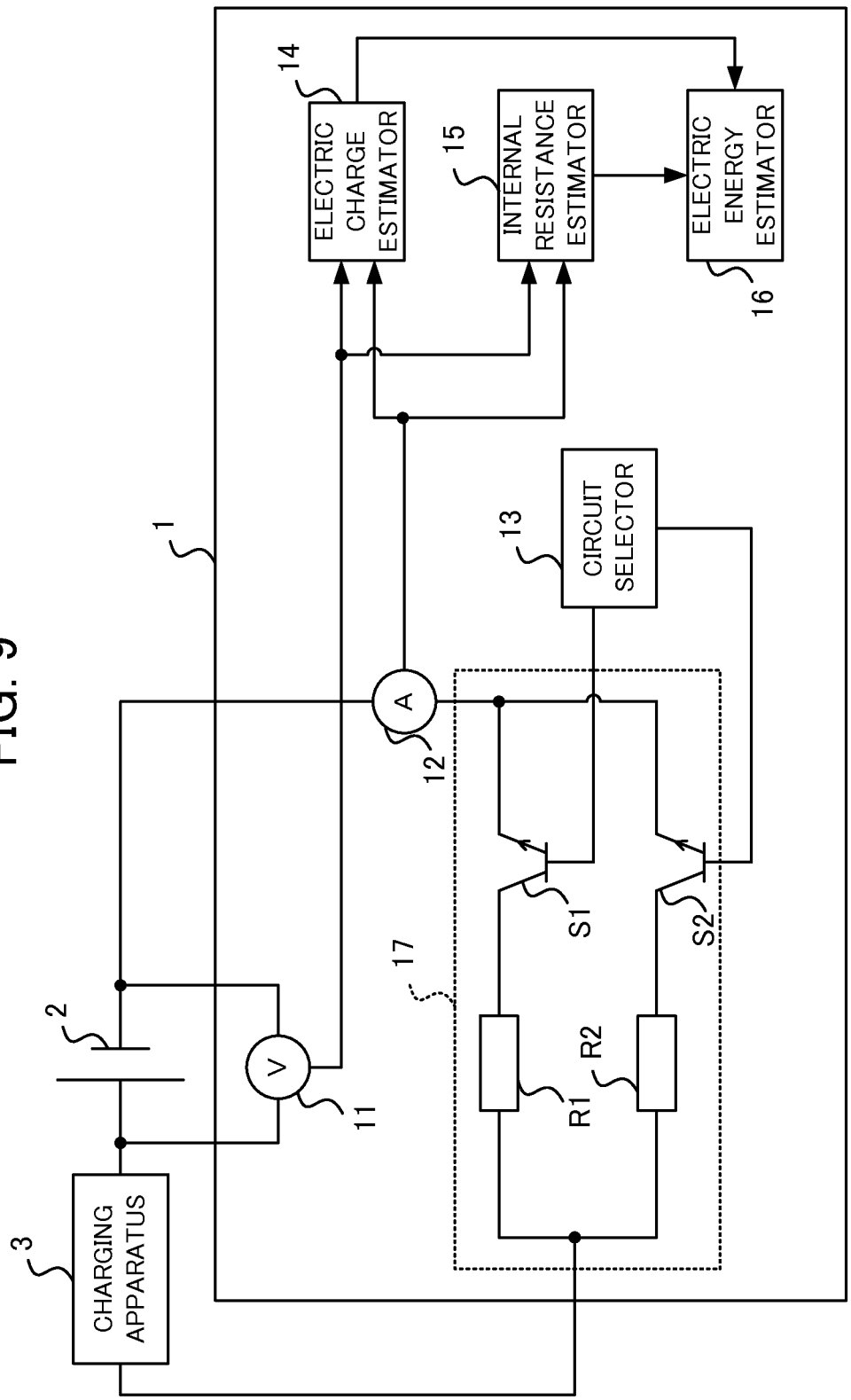
FIG. 9 is a block diagram illustrating a different example configuration of the apparatus for estimating power storage device degradation according to Embodiment 1.

In the above example, the internal resistance and the relationship between the electric charge and the open voltage are computed based on the voltage and the current detected during discharging of the power storage device 2, but the internal resistance and the relationship between the electric charge and the open voltage may also be computed based on the voltage and the current detected during charging of the power storage device 2. FIG. 9 is a block diagram illustrating a different example configuration of the apparatus for estimating power storage device degradation according to Embodiment 1. The power storage device 2 is charged by a charging apparatus 3. Operation of each component of the apparatus for estimating power storage device degradation 1 illustrated in FIG. 9 is similar to that of the apparatus for estimating power storage device degradation 1 illustrated in FIG. 1.

Figure 10:
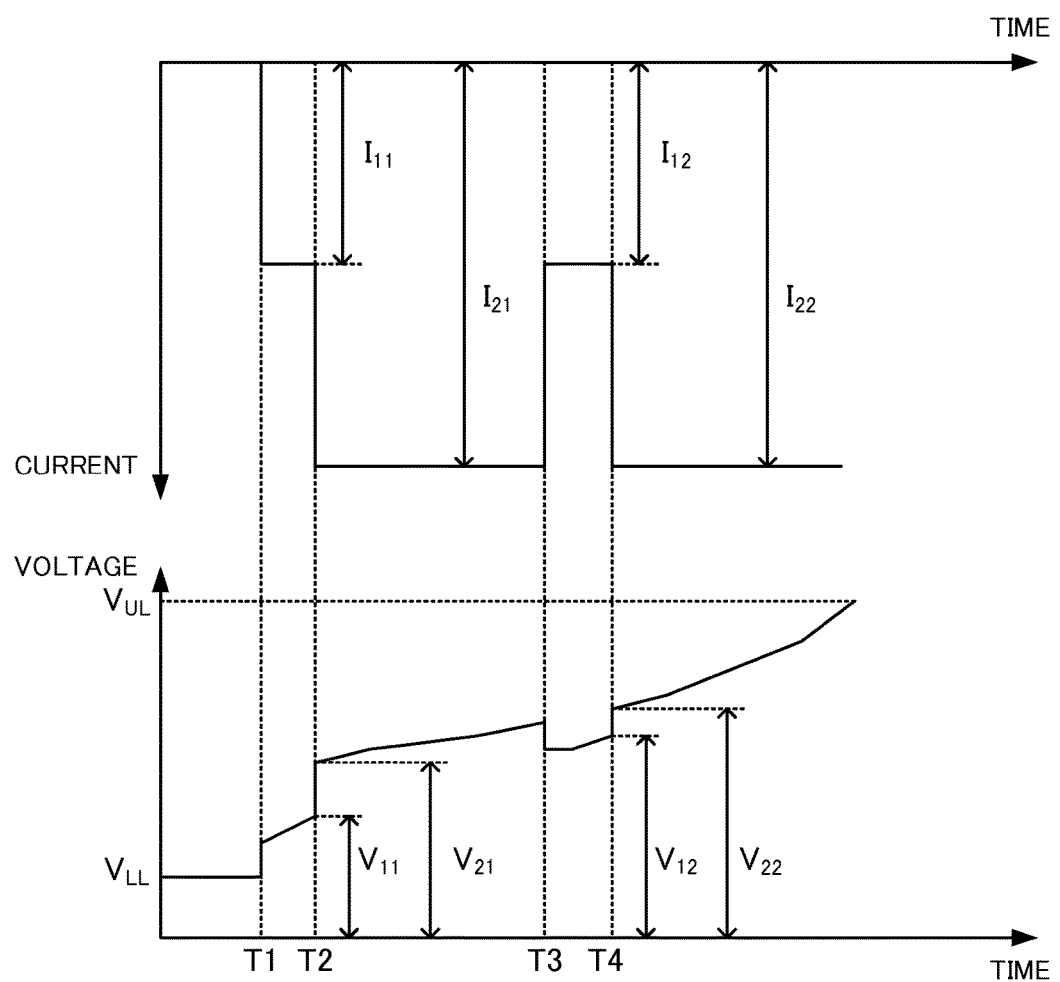
FIG. 10 is a diagram illustrating a different example of changes in a current flowing through the power storage device and in the voltage of the power storage device according to Embodiment 1.

FIG. 10 is a diagram illustrating a different example of changes in a current flowing through the power storage device and in the voltage of the power storage device according to Embodiment 1. The top part illustrates the current, while the bottom part illustrates the voltage. The horizontal axis is time, while the vertical axis of the top part is current, and the vertical axis of the bottom part is voltage. An example will be described for a case in which charging starts in a state in which the voltage is less than or equal to a third threshold value, and charging is conducted until the voltage becomes equal to or greater than a fourth threshold value. Note that the third threshold value and the fourth threshold value may be arbitrarily determined. For example, a lower limit voltage of the power storage device 2 is set to the third threshold value, and an upper limit voltage of the power storage device 2 is set to the fourth threshold value. Note that a charge current is expressed as negative. As illustrated in FIG. 10, the voltage changes from a lower limit voltage $V_{LL}$ to an upper limit voltage $V_{UL}$.

Starting from a state in which the voltage is the lower limit voltage $V_{LL}$ and the switches S1 and S2 are off, at time T1, the switch S1 is switched on, and charging of the power storage device 2 starts. During the period from time T1 to time T2, the current is $-I_{11}$, and the voltage increases to $V_{11}$ over the period from time T1 to time T2. At time T2, the switch S2 is additionally switched on, the current becomes $-I_{21}$, and the voltage becomes $V_{21}$. During the period from time T2 to time T3, the current is $-I_{21}$, and the voltage increases over the period from time T2 to time T3. At time T3, the switch S2 is switched off, the current becomes $-I_{12}$, and the voltage decreases to approximately $V_{21}$. During the period from time T3 to time T4, the current is $-I_{12}$, and the voltage increases to $V_{12}$ over the period from time T3 to time T4. At time T4, the switch S2 is switched on, the current becomes $-I_{22}$, and the voltage becomes $V_{22}$. Starting from time T4, the voltage detector 11 and the current detector 12 detect the voltage and the current at arbitrarily determined intervals until the voltage reaches the upper limit voltage.

Similarly to the discharging case discussed earlier, the internal resistance estimator 15 computes the internal resistance of the power storage device 2 based on the voltages and currents at times when the resistance values of the charge/discharge circuit 17 are mutually different, such as immediately before and immediately after time T2, for example, and the internal resistance estimator 15 computes the internal resistance of the power storage device 2 based on the voltage and the current immediately before and immediately after time T4. The electric charge estimator 14 computes the electric charge by time-integrating the absolute value of the current from time T1 when charging started, until time T2, for example. Also, the electric charge estimator 14 computes the electric charge by time-integrating the absolute value of the current from time T1 when charging started, until time T4, for example. Similarly to the discharging case discussed earlier, the electric charge estimator 14 computes the relationship between the electric charge and the voltage.

Similarly to the discharging case discussed earlier, the electric energy estimator 16 computes the relationship between the electric charge and the open voltage of the power storage device 2 based on the relationship between the electric charge and the voltage, the current, and the internal resistance. Subsequently, based on the computed values, the electric energy estimator 16 estimates the electric energy of the power storage device 2 based on usage conditions when the power storage device 2 is used. Similarly to the discharging case discussed earlier, the electric energy of the power storage device 2 may also be estimated based on values computed during charging of the power storage device 2.

As described above, according to the apparatus for estimating power storage device degradation 1 in accordance with Embodiment 1 of the present disclosure, it becomes possible to improve the accuracy of estimating the electric energy of the power storage device 2.

Embodiment 2

Figure 11:
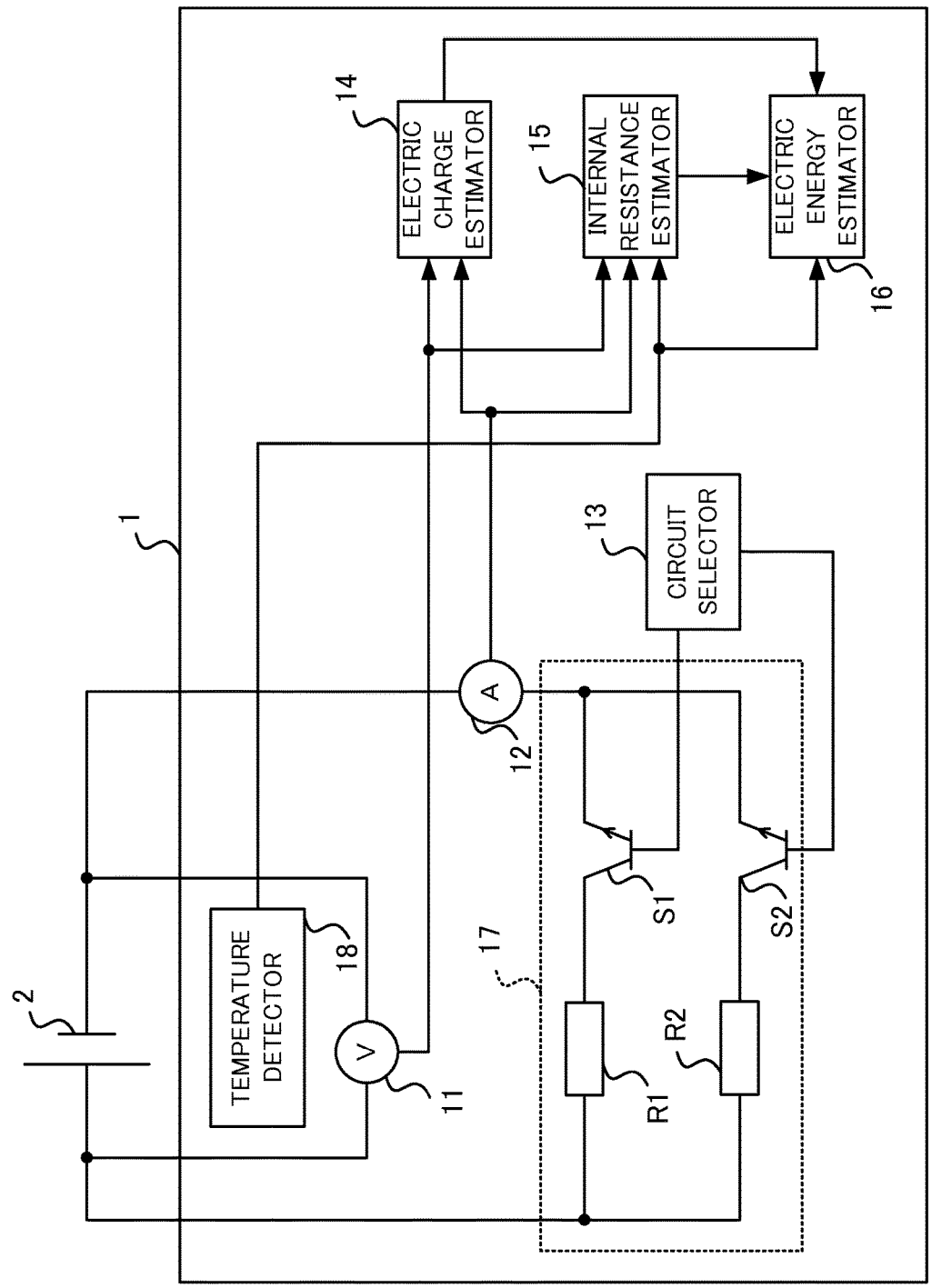
FIG. 11 is a block diagram illustrating an example configuration of an apparatus for estimating power storage device degradation according to Embodiment 2 of the present disclosure.

FIG. 11 is a block diagram illustrating an example configuration of the apparatus for estimating power storage device degradation according to Embodiment 2 of the present disclosure. The apparatus for estimating power storage device degradation 1 according to Embodiment 2 is additionally provided with a temperature detector 18, in addition to the configuration of the apparatus for estimating power storage device degradation 1 according to Embodiment 1. Operations of the apparatus for estimating power storage device degradation 1 that differ from Embodiment 1 will be described.

The temperature detector 18 detects the surface temperature of the power storage device 2, or estimates the internal temperature of the power storage device 2, at arbitrarily determined times. The temperature detector or temperature estimation uses arbitrary technology of the related art. The temperature detector 18 detects the surface temperature of the power storage device 2 at times in conjunction with the computation of the internal resistance, for example. When the voltage and the current changes as in FIG. 2, the temperature detector 18 detects the surface temperature of the power storage device 2 at time T2, for example.

Figure 12:
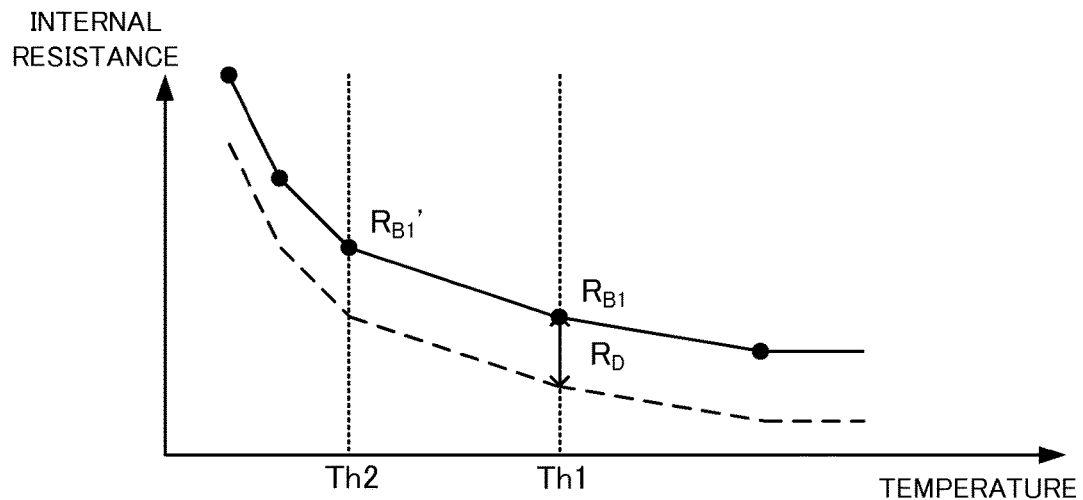
FIG. 12 is a diagram illustrating an example of a relationship between the temperature and internal resistance of the power storage device according to Embodiment 2.

The internal resistance estimator 15 computes the internal resistance similarly to Embodiment 1. The computation of the internal resistance is conducted under conditions in which the temperature differs, and the relationship between the temperature detected by the temperature detector 18 and the internal resistance is computed. FIG. 12 is a diagram illustrating an example of a relationship between the temperature and internal resistance of the power storage device according to Embodiment 2. The internal resistance estimator 15 obtains the internal resistance at respective temperatures, as indicated by the black circles in FIG. 12. The internal resistance estimator 15 interpolates the obtained internal resistance values, and computes a relationship between temperature and internal resistance as illustrated by the solid-line graph in FIG. 12.

Alternatively, the internal resistance estimator 15 corrects a predetermined relationship between temperature and internal resistance based on the temperature detected by the temperature detector 18 and the internal resistance computed similarly to Embodiment 1. As illustrated by the dashed-line graph in FIG. 12, the internal resistance estimator 15 stores a predetermined relationship between temperature and internal resistance. Based on the difference $R_D$ between the internal resistance computed based on the voltage and the current when the temperature detected by the temperature detector 18 is Th1, and an internal resistance based on the predetermined relationship between temperature and internal resistance, the internal resistance estimator 15 corrects the predetermined relationship between temperature and internal resistance, and obtains a relationship between temperature and internal resistance as illustrated by the solid-line graph in FIG. 12.

Based on the values computed as discussed above, the electric energy estimator 16 estimates the electric energy of the power storage device 2 based on usage conditions when the power storage device 2 is used. Electric energy estimation is described below. The electric energy estimator 16 corrects the internal resistance based on the temperature of the power storage device 2 when discharging or charging, and the computed relationship between temperature and internal resistance, or the corrected relationship between temperature and internal resistance. An example will be described for a case of discharging the power storage device 2 from a state in which the voltage of the power storage device 2 is the upper limit voltage until the voltage reaches the lower limit voltage, while keeping the discharge current at a constant value I. Provided that Th2 is the temperature when discharging started, the internal resistance is $R_{B1}'$, as indicated by the computed relationship between temperature and internal resistance or the corrected relationship between temperature and internal resistance illustrated in FIG. 12.

Figure 13:
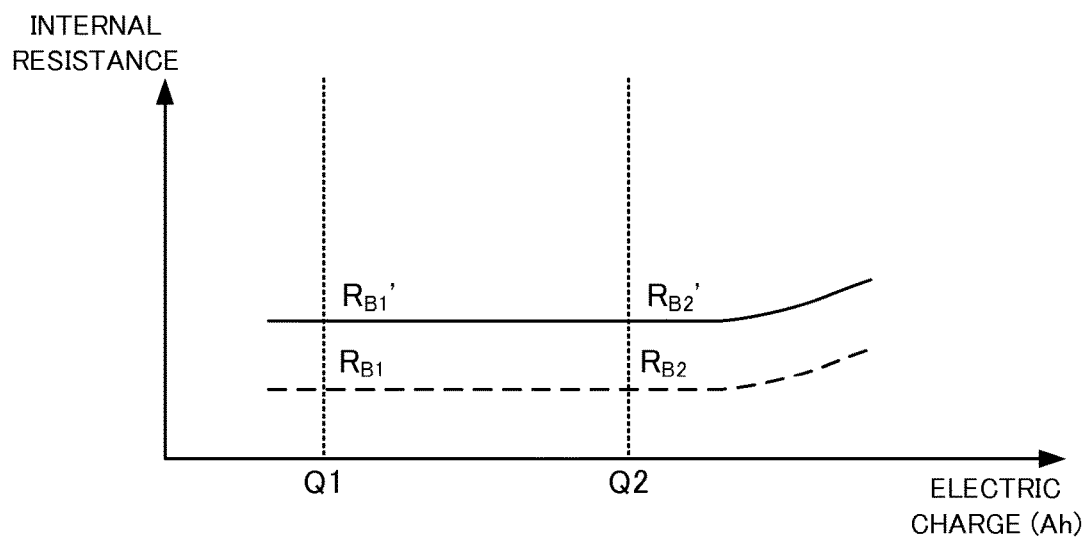
FIG. 13 is a diagram illustrating an example of a relationship between the electric charge and internal resistance according to Embodiment 2.

FIG. 13 is a diagram illustrating an example of a relationship between the electric charge and internal resistance according to Embodiment 2. Based on the temperature Th2 when discharging started and the computed relationship between temperature and internal resistance or the corrected relationship between temperature and internal resistance illustrated in FIG. 12, the electric energy estimator 16 corrects the relationship between the electric charge and the internal resistance indicated by the dashed line in FIG. 13, and computes the relationship between the electric charge and the internal resistance indicated by the solid line in FIG. 13. Similarly to Embodiment 1, the electric energy estimator 16 acquires the discharge current value I, and acquires the upper limit voltage $V_{UL}'$ and the lower limit voltage $V_{LL}'$ of the power storage device 2 during discharging. Provided that the discharge current is I, since a voltage drop occurs, the voltage $V_1$ of the power storage device 2 corresponding to the electric charge $Q_1$ is expressed as $V_1=E_1-I \cdot R_{B1}'$. Also, the voltage $V_2$ of the power storage device 2 corresponding to the electric charge $Q_2$ is expressed as $V_2=E_2-I \cdot R_{B2}'$. As illustrated in FIG. 13, $R_{B1}'$ and $R_{B2}'$ are the internal resistance corrected based on the temperature when discharging started. Note that the temperature is not limited to the temperature when discharging started, and the relationship between the electric charge and the internal resistance may also be corrected based on the temperature after an arbitrarily determined fixed time elapses since the start of discharging, or an average value of the temperature over a fixed time since the start of discharging.

As discussed above, the electric energy estimator 16 computes the relationship between the electric charge and the voltage of the power storage device 2 during discharging when the discharge current is kept at a constant value I, based on the relationship between the electric charge and the open voltage of the power storage device 2, the internal resistance corrected based on the temperature when discharging started, and the discharge current I. Similarly to Embodiment 1, within the range determined by the upper limit voltage $V_{UL}'$ and the lower limit voltage $V_{LL}'$, the electric energy estimator 16 integrates the voltage of the power storage device 2 during discharging when the discharge current is kept at a fixed value I that corresponds to the electric charge, and estimates the electric energy of the power storage device 2.

Note that when charging the voltage of the power storage device 2, the electric energy estimator 16 may estimate the electric energy of the power storage device 2 according to the charging conditions, similarly to the example discussed above. According to the apparatus for estimating power storage device degradation 1 in accordance with Embodiment 2, the relationship between electric charge and open voltage is computed based on the voltage and the current measured by the voltage detector 11 and the current detector 12, and the electric energy of the power storage device 2 may be estimated for individual discharging or charging conditions, excluding the effects of a voltage drop caused by internal resistance that varies according to the temperature of the power storage device 2. Consequently, it becomes possible to improve the accuracy of estimating the electric energy of the power storage device 2.

FIG. 14 is a flowchart illustrating an example of measurement operations conducted by the apparatus for estimating degradation in the power storage device according to Embodiment 2. Steps S110 to S160 are similar to the processing of steps S110 to S160 conducted by the apparatus for estimating power storage device degradation 1 according to Embodiment 1 illustrated in FIG. 7. The internal resistance estimator 15 computes a relationship between the temperature detected by the temperature detector 18 and the internal resistance computed similarly to Embodiment 1, or alternatively, corrects a predetermined relationship between temperature and internal resistance based on the temperature detected by the temperature detector 18 and the internal resistance computed similarly to Embodiment 1 (step S170).

FIG. 15 is a flowchart illustrating an example of electric energy estimation operations conducted by the apparatus for estimating degradation in the power storage device according to Embodiment 2. The electric energy estimator 16 corrects the relationship between the electric charge and the internal resistance based on the temperature when discharging started, and the computed relationship between temperature and internal resistance or the corrected relationship between temperature and internal resistance (step S201). The processing of step S210 is similar to the operations conducted by the apparatus for estimating power storage device degradation 1 according to Embodiment 1 illustrated in FIG. 8. The electric energy estimator 16 computes the relationship between the electric charge and the voltage of the power storage device 2 during charging or discharging, based on the relationship between the electric charge and the open voltage of the power storage device 2, the internal resistance corrected based on the temperature when discharging started, and the charge/discharge current (step S221). The processing of step S230 is similar to the operations conducted by the apparatus for estimating power storage device degradation 1 according to Embodiment 1 illustrated in FIG. 8.

As described above, according to the apparatus for estimating power storage device degradation 1 in accordance with Embodiment 2 of the present disclosure, it becomes possible to improve the accuracy of estimating the electric energy of the power storage device 2.

An embodiment of the present disclosure is not limited to the foregoing embodiments. The configuration of the charge/discharge circuit 17 is not limited to the configuration of FIG. 1, and an arbitrary circuit able to modify the resistance value of the charge/discharge circuit 17 may be used. The resistance values of the resistors R1 and R2 are arbitrary values determined in conjunction with the scale of the power storage device 2. The power storage device 2 is provided with a single cell or multiple cells. Also, the switching times and sequence of the switches S1 and S2 are arbitrary, and not limited to the foregoing embodiments.

In the foregoing embodiments, the electric charge estimator 14 uses Ah as the units of electric charge, but the units of electric charge are not limited to Ah, and a unit matched to the charge/discharge rate of the power storage device 2 may be used. For example, if the internal resistance of the power storage device 2 is extremely small and the charge/discharge rate is comparatively high, a measurement time of several hours is not required, and thus As or Amin may be used. The circuit selector 13 may also be configured to switch the switches S1 and S2 at times when the electric charge computed by the electric charge estimator 14 reaches an arbitrarily determined threshold value.

If the power storage device 2 drives a vehicle an electric railcar, an automobile, or the like, the electric energy of the power storage device 2 may be computed daily by utilizing a parked time of several hours at night, for example. Consequently, the daily degree of degradation in the power storage device 2 may be assessed accurately.

In the foregoing embodiments, various modifications are possible within the scope of the spirit of the present disclosure. The foregoing embodiments are for the purpose of describing the present disclosure, and are not intended to limit the scope of the present disclosure. The scope of the present disclosure is indicated by the attached claims rather than the embodiments. Various modifications made within the scope of the claims and their equivalents are to be included in the scope of the present disclosure.

INDUSTRIAL APPLICABILITY

The present disclosure may be suitably adopted in an apparatus for estimating power storage device degradation, which estimates the electric energy of a power storage device.

REFERENCE SIGNS LIST 1 apparatus for estimating power storage device degradation
2 power storage device
3 charging apparatus
11 voltage detector
12 current detector
13 circuit selector
14 electric charge estimator
15 internal resistance estimator
16 electric energy estimator
17 charge/discharge circuit
18 temperature detector
R1, R2 resistor
S1, S2 switch

What is claimed is:

1. An apparatus for estimating power storage device degradation, comprising:

a charge/discharge circuit, including a resistor, that is connected to a power storage device;

a switch to switch an electrical pathway of the charge/discharge circuit to change a resistance value of the charge/discharge circuit;

a voltage detector to detect a voltage of the power storage device;

a current detector to detect a current flowing through the power storage device;

a circuit selector to select the switch such that a resistance value of the charge/discharge circuit changes at least once from starting a discharging of the power storage device in a state in which the voltage is equal to or greater than a first threshold value until the voltage becomes less than or equal to a second threshold value, or from starting a charging of the power storage device in a state in which the voltage is less than or equal to a third threshold value until the voltage becomes equal to or greater than a fourth threshold value;

an electric charge estimator to compute an electric charge by time-integrating the current from a start time of the discharging or the charging to an arbitrarily determined time, and compute a relationship between the electric charge and the voltage;

an internal resistance estimator to compute an internal resistance of the power storage device, based on the voltages and currents at times when resistance values of the charge/discharge circuit are different since starting the discharging or the charging; and an electric energy estimator to compute a relationship between the electric charge and an open voltage of the power storage device based on the relationship between the electric charge and the voltage, the current, and the internal resistance, and to estimate an electric energy of the power storage device based on the relationship between the electric charge and the open voltage, the internal resistance, and a current flowing through the power storage device during discharging or charging.

2. The apparatus for estimating power storage device degradation according to claim 1, further comprising:

a temperature detector to detect a temperature of the power storage device, wherein the internal resistance estimator computes a relationship between temperature and internal resistance by interpolating based on different values of the temperature and the internal resistance, or corrects a predetermined relationship between temperature and internal resistance based on the temperature and the internal resistance, and the electric energy estimator corrects the internal resistance based on a temperature of the power storage device during discharging or charging and the computed relationship between temperature and internal resistance or the corrected relationship between temperature and internal resistance, and estimates an electric energy of the power storage device based on a relationship between the electric charge and an open voltage of the power storage device, the corrected internal resistance, and a current flowing through the power storage device during discharging or charging.

3. A method for estimating power storage device degradation, conducted by an apparatus for estimating power storage device degradation that includes a charge/discharge circuit, including a resistor, that is connected to a power storage device, and a switch to switch an electrical pathway of the charge/discharge circuit to change a resistance value of the charge/discharge circuit, the method comprising:

detecting a voltage of the power storage device;

detecting a current flowing through the power storage device;

switching the switch such that a resistance value of the charge/discharge circuit changes at least once from starting a discharging of the power storage device in a state in which the voltage is equal to or greater than a first threshold value until the voltage becomes less than or equal to a second threshold value, or from starting a charging of the power storage device in a state in which the voltage is less than or equal to a third threshold value until the voltage becomes equal to or greater than a fourth threshold value;

computing an electric charge by time-integrating the current from a start time of the discharging or the charging to an arbitrarily determined time, and computing a relationship between the electric charge and the voltage;

computing an internal resistance of the power storage device, based on the voltages and currents at times when resistance values of the charge/discharge circuit are different since starting the discharging or the charging; and computing a relationship between the electric charge and an open voltage of the power storage device based on the relationship between the electric charge and the voltage, the current, and the internal resistance, and estimating an electric energy of the power storage device based on the relationship between the electric charge and the open voltage, the internal resistance, and a current flowing through the power storage device during discharging or charging.

* * * * *